(12) United States Patent
Pradeep et al.

(10) Patent No.: US 6,316,304 B1
(45) Date of Patent: Nov. 13, 2001

(54) METHOD OF FORMING SPACERS OF MULTIPLE WIDTHS

(75) Inventors: Yelehanka Ramachandramurthy Pradeep; Jie Yu; Tjin Tjin Tjoa; Kelvin Wei Loong Loh, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/614,553

(22) Filed: Jul. 12, 2000

(51) Int. Cl.[7] ................................................ H01L 21/8238
(52) U.S. Cl. .................... 438/230; 438/199; 438/303; 438/305; 257/371
(58) Field of Search .................................. 438/199, 230, 438/231, 303, 305, 395; 257/371

(56) References Cited

U.S. PATENT DOCUMENTS

| | | | |
|---|---|---|---|
| 5,015,595 | * 5/1991 | Wollesen | 438/231 |
| 5,021,354 | 6/1991 | Pfiester | 438/230 |
| 5,405,791 | 4/1995 | Ahmad et al. | 438/228 |
| 5,424,572 | 6/1995 | Solheim | 257/370 |
| 5,460,998 | 10/1995 | Liu | 438/231 |
| 5,786,247 | 7/1998 | Chang et al. | 438/231 |
| 5,874,330 | 2/1999 | Ahn | 438/230 |

* cited by examiner

Primary Examiner—Charles Bowers
Assistant Examiner—Hsien-Ming Lee

(74) Attorney, Agent, or Firm—George O. Saile; Rosemary L. S. Pike

(57) ABSTRACT

A method is described for forming gate sidewall spacers having different widths. The variation in spacer width allows for optimization of the MOSFET characteristics by changing the dimensions of the lightly doped source/drain extensions. The process is achieved using a method where the gate structure, comprising the gate electrode and gate oxide, is formed by conventional techniques upon a substrate. Lightly doped source drain extensions are implanted into the substrate not protected by the gate structure. The exposed substrate and gate structure are then covered with an insulating liner layer. This is followed by an etch stop layer deposition over the insulating liner layer. A first spacer oxide layer is then deposited over the etch stop layer. Areas where thicker spacers are desired are masked, and the unmasked spacer oxide layer is removed. The mask is then stripped away and additional spacer oxide is grown over the entire surface. The result is a thicker oxide in the areas protected by the mask during the previous etch step. The oxide is anisotropically etched and spacers are formed along the gate sidewalls. The spacers are wider in the areas with the thicker oxide. The process continues by etching the etch stop layer not protected by the spacers. The source and drain electrodes are then formed by implanting ions into the substrate not protected by the gate structure and sidewall spacers. Adjustment of the spacer width is accomplished by adjusting the total thickness of the etch stop and spacer oxide layers. Spacer width variation is controlled by changing the deposition thickness of the first spacer oxide layer.

27 Claims, 4 Drawing Sheets

METHOD OF FORMING SPACERS OF MULTIPLE WIDTHS

BACKGROUND OF THE INVENTION (1) Field of the Invention

The invention generally relates to an interconnection process used in semiconductor manufacturing and, more particularly, to a method of forming different width sidewall spacers in the fabrication of integrated circuits.

(2) Description of Prior Art

In sub-quarter-micron MOSFET architectures, it is necessary to use ultra-shallow lightly doped source and drain extension (LDD) regions. Low energy ion implantation is typically used to form LDD regions in the substrate adjacent to the gate structure. Spacers are then formed on the sidewalls of the gate. The spacers protect the channel and LDD regions from a subsequent higher-dose implantation used to form the MOSFET source and drain (S/D).

Referring now to FIG. 1, showing in cross section the prior art of spacer formation, a substrate 10 is provided. The substrate 10 may contain n or p type wells, devices, junctions, and other features (not shown) formed prior to deposition and patterning of the gate oxide 12 and silicon gate 14. The patterned gate oxide 12 and silicon gate 14 form the gate structure of the MOS transistor. A low energy implantation is performed to create the LDD regions 16. A spacer oxide layer 18 is then deposited covering the surface of both the gate structure 12/14 and the exposed substrate 10.

Referring now to FIG. 2, the spacer oxide layer 18 is partially etched away. A portion of the spacer oxide layer 18 remains along the sidewalls of the gate structure 12/14 forming equal width spacers beside the gate. A subsequent implantation (not shown) creating the more heavily doped source and drain (S/D) regions 20 is masked by the sidewall spacers.

In order to mix transistors from different process technologies or with different operating voltages, it is desirable to have different LDD widths for PMOS and NMOS transistors. The width of the LDD region is typically controlled by the width of the gate sidewall spacers. Other approaches for forming different spacer widths exist. U.S. Pat. No. 5,021,354 to Pfiester teaches a method that takes advantage of variation in oxidation of regions with different dopants to form spacers of differing widths. U.S. Pat. No. 5,405,791 to Ahmad et al. teaches a method where equal width spacers are formed. The PMOS device is then masked and an n+ source/drain (S/D) implantation is performed in the NMOS device. The mask is removed and additional oxide is deposited. The NMOS device is then masked and the oxide etched to form the optimal spacer width on the PMOS device. A p+ implantation then forms the S/D regions in the PMOS device. The spacers are then removed and the lightly doped source/drain (LDD) extensions are implanted. Unfortunately, the Ahmad invention cannot be adapted to a self-aligned silicide (salicide) metalization process since the completed device has a covering of silicon nitride. In addition, it has the limitation of only facilitating different spacer widths between NMOS and PMOS devices. U.S. Pat. No. 5,460,998 to Liu teaches a method similar to Ahmad except that the LDD extensions are implanted prior to forming the spacers. U.S. Pat. No. 5,424,572 to Solheim teaches a method that takes advantage of the 8:1 ratio of oxide growth over n+ and p+ regions, respectively. The oxide is grown and then etched, leaving spacers only along the n+ doped sidewalls. U.S. Pat. No. 5,786,247 to Chang et al. teaches a method where spacers are formed in separate steps over the NMOS and PMOS regions allowing individual adjustment of the LDD profiles. U.S. Pat. No. 5,874,330 to Ahn teaches a method where nitride caps are formed over selected devices. The surface is covered with oxide, which is then etched, allowing selective LDD implantation.

SUMMARY OF THE INVENTION

A principal object of the present invention is to provide a process that allows the formation of spacers with different widths.

Another object of the present invention is to provide a method that reduces the number of process steps required to form spacers of different widths.

Another object of the present invention is to provide a method of forming different width spacers allowing optimization of MOSFET device characteristics by adjustment of the LDD region dopant profile.

Another object of the present invention is to provide a method of forming spacers where the width of the spacers is easily controlled.

Another object of the present invention is to provide a process of forming different width spacers where the difference in size of the spacers is controllable.

A still further object of the present invention is to provide a method of forming different spacer widths on MOS devices independent of the device type (PMOS or NMOS).

A still further object of the present invention is a process of providing different spacer widths on MOS devices which is compatible with self-aligned silicide (salicide) metalization processing.

These objects are achieved using a process where the gate structure, comprising a gate dielectric covered by a gate electrode, is formed by conventional techniques upon a substrate. An implantation is performed to form LDD regions in the substrate not protected by the gate structure. The exposed substrate and gate structure are then covered with an insulating liner layer and an etch stop layer. A thin spacer oxide layer is then deposited over the etch stop layer. Areas where ticker spacers are desired are masked and the unmasked spacer oxide layer is removed. The mask is then stripped away and additional spacer oxide layer is grown over the surface. The result is a thicker spacer oxide layer in areas protected by the mask during the previous etching. The spacer oxide layer is then anisotropically etched forming spacers along the gate sidewalls. The spacers are wider in the areas with the thicker oxide. The process continues by etching away the etch stop layer not protected by the spacers. Adjustment of the spacer width is accomplished by varying the total thickness of the etch stop and spacer oxide layers. Adjustment of the difference in spacer width is controlled by the thickness of the first spacer oxide deposition The process is completed by implanting the substrate in areas not protected by the gate structure and sidewall spacers to form the source and drain (S/D).

BRIEF DESCRIPTION OF THE DRAWINGS

In the accompanying drawings forming a material part of this description, there is shown.

DESCRIPTION OF THE PREFERRED EMBODIMENTS

The preferred embodiment describes formation of sidewall spacers on gate structure sidewalls to be used to mask a subsequent source/drain (S/D) implantation. While this embodiment describes spacers along the sidewalls of a gate electrode, it will be understood by those skilled in the art that the invention can be extended to the formation of different width spacers on any structure on a semiconductor wafer.

Figure 1:
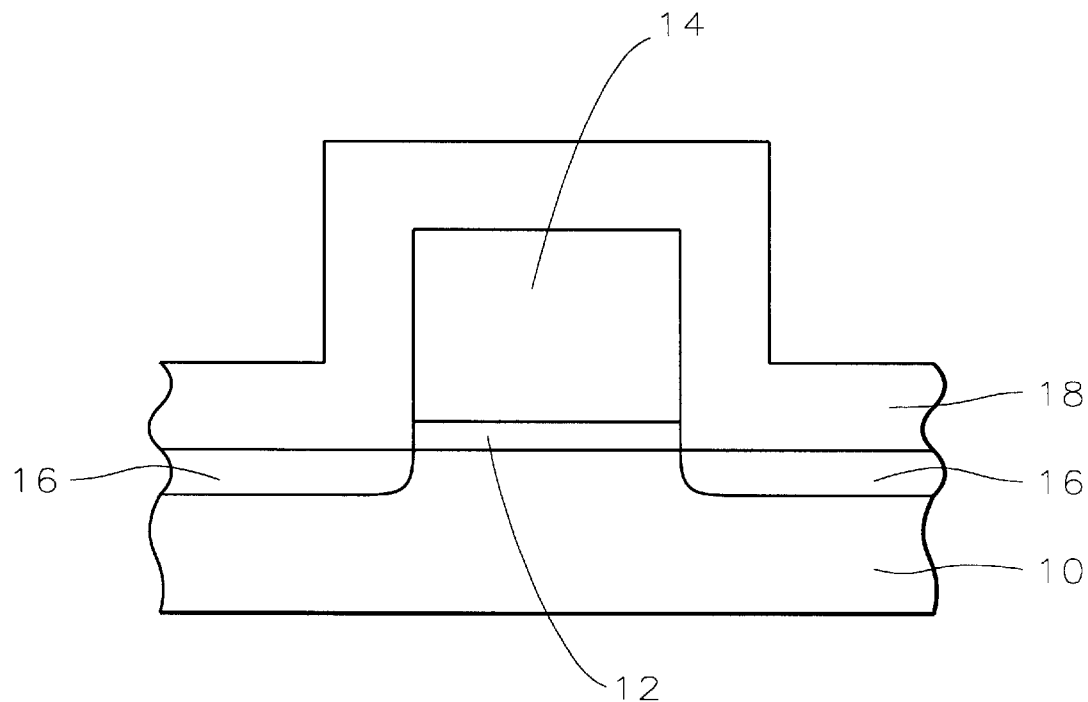
FIGS. 1 and 2 schematically illustrating in cross-sectional representation of the prior art of spacer formation.
Figure 2:
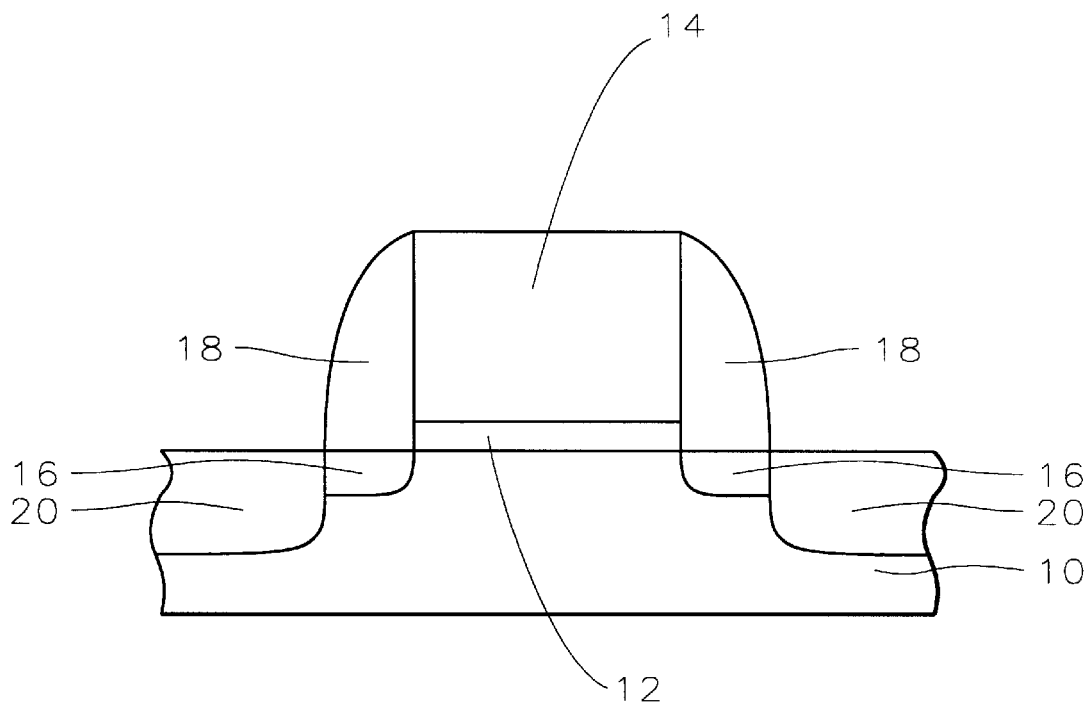
Figure 3:
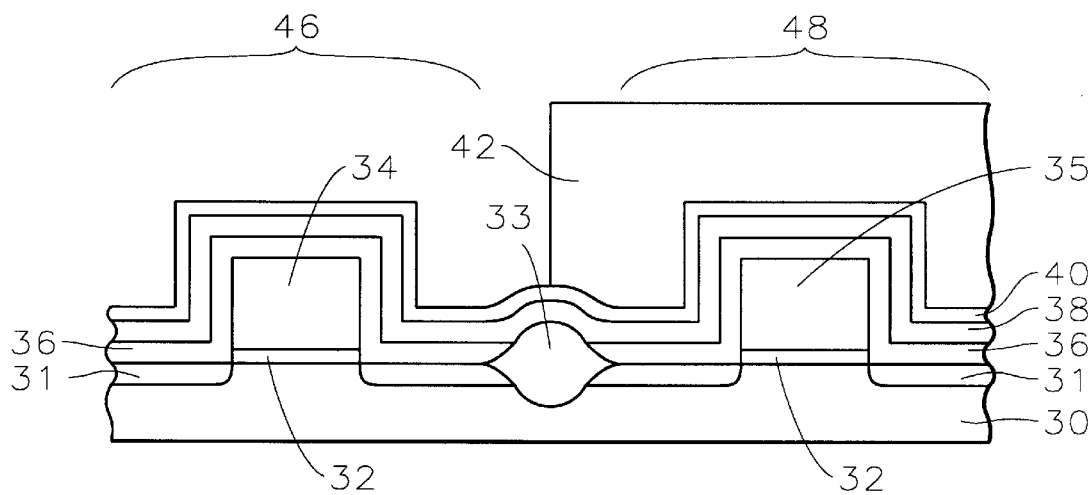
FIGS. 3 through 9 schematically illustrating in cross-sectional representation of the present invention.
Figure 4:
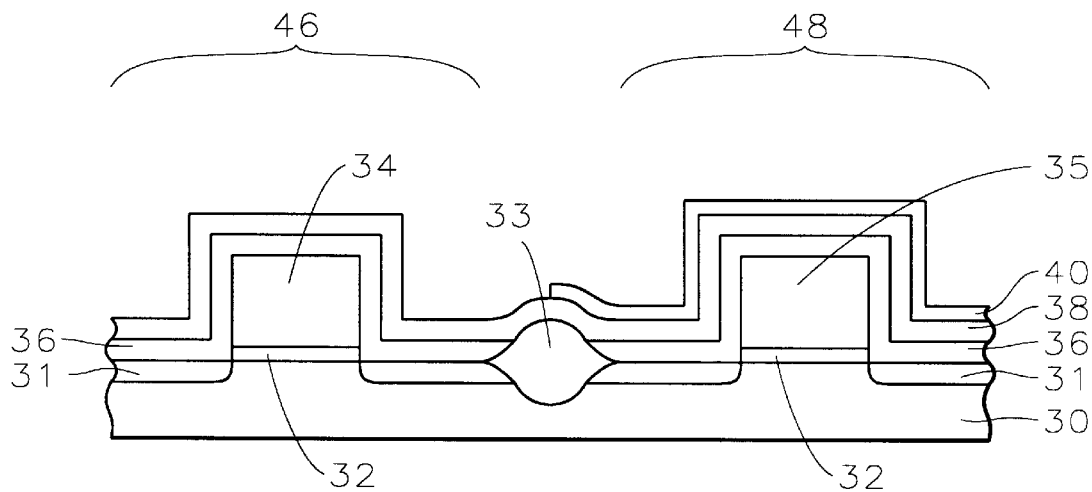

Referring now more particularly to FIG. 3 where two partially formed gate structures are represented. A substrate 30 is provided with two partially formed MOS transistors 46 and 48 separated by field oxide 33. The substrate 30 may contain n or p type wells, devices, junctions, and other features (not shown) formed prior to deposition and patterning of the gate dielectric 32, conductive gates 34 and 35, and field oxide 33. The gate dielectric 32 may comprise one or more of a list containing silicon oxide, tantalum pentoxide, or titanium oxide. The conductive gates 34 and 35 may comprise one or more of a list containing silicon, polysilicon or conductive metal. The patterned gate dielectric 32 and conductive gates 34 and 35 form the gate structures 32/34 and 32/35 of transistor 46 and transistor 48, respectively. Separate implantations (not shown) form the LDD regions 31 in the substrate 30 not protected by the gate structures 32/34 and 32/35. An insulating liner layer 36 composed of silicon oxide is deposited or grown overlying the gate structures 32/34 and 32/35 and the exposed surface of the substrate 30 to a thickness of between about 50 to 200 Angstroms. This is achieved by thermal oxidation, low-pressure chemical vapor deposition (LPCVD), or pressure enhanced chemical vapor deposition (PECVD). An etch stop layer 38 comprised of silicon nitride, or silicon oxynitride is then deposited overlying the insulating liner layer 36 by LPCVD or PECVD to a thickness of between about 100 to 300 Angstroms. A first spacer oxide layer 40 is deposited overlying the etch stop layer 38 by LPCVD or PECVD to a thickness of between about 100 to 400 Angstroms. Photoresist is coated overlying the first spacer oxide layer 40. A photomask, not shown, is positioned over the photoresist. The photoresist is then exposed using actinic light using I-line photolithography, for example, and then developed to leave a photoresist mask 42 overlying the transistor 48, as shown in FIG. 3. The first spacer oxide layer 40 is then etched away from the areas not protected by the photoresist mask 42 using wet etching. This exposes the etch stop layer 38 over transistor 46 as depicted in FIG. 4.

Figure 5:
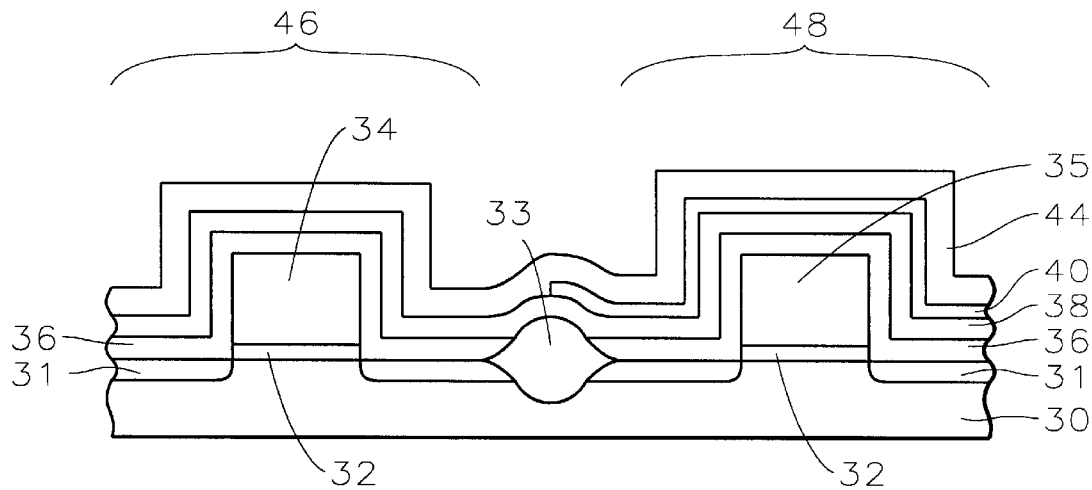

Referring now to FIG. 5, a second spacer oxide layer 44 is deposited overlying the surface of both transistor 46 and transistor 48 by LPCVD or PECVD to a thickness of between about 300 to 800 Angstroms. The second spacer oxide layer 44 is not distinguishable from the first spacer oxide layer 40 over transistor 48.

Figure 6:
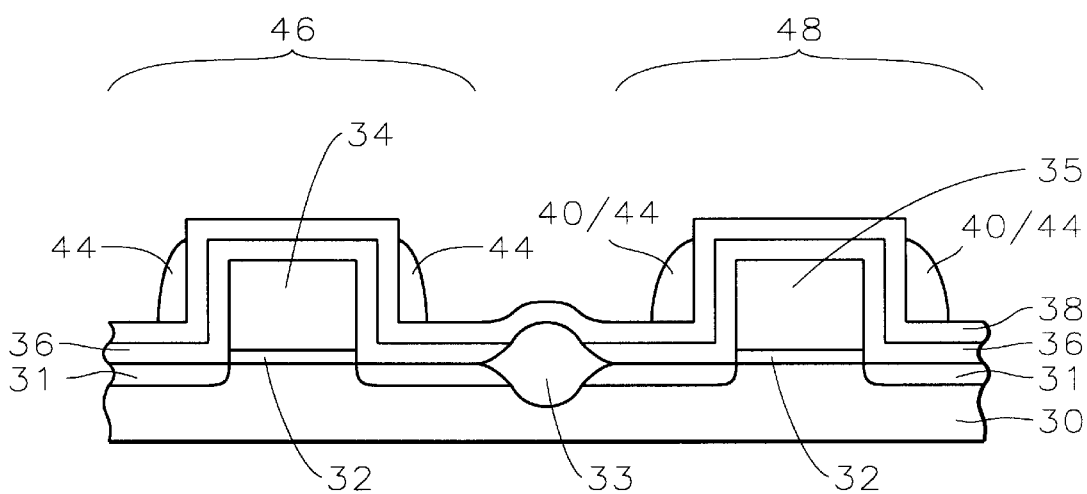

Referring now to FIG. 6, the spacer oxide layer 40/44 is anisotropically etched by dry etching using $C_4F_8/Ar$, $C_2F_6/Ar$, or $C_5F_8/Ar$, for example, with etch selectivity greater than 10:1 between the spacer oxide layer 40/44 and the etch stop layer 38. Endpoint detection is determined when oxide 40 over the gate structures 32/34 of transistor 46 has been removed. This is followed by an in-situ over-etch using the same process to remove the additional oxide 40/44 over the gate structures 32/35 of transistor 48. This forms the spacers on the sideways of transistor 46 and transistor 48.

Figure 7:
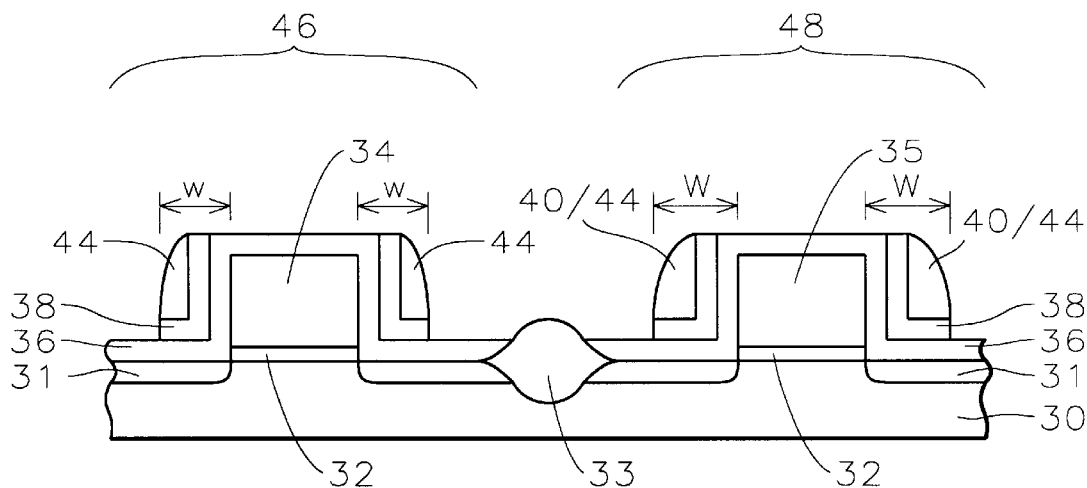

Referring now to FIG. 7, the exposed etch stop layer is etched away using a plasma etch process with a chemistry of $SF_4/HBr$ or $CF_4/HBr$, thereby completing the spacer formation. Two different spacer widths (w and W) are shown along the sidewalls of the gate structures 32/34 and 32/35 of transistor 46 and transistor 48. The typical difference in widths between W and w (W−w) are between about 100 to 400 Angstroms.

Figure 8:
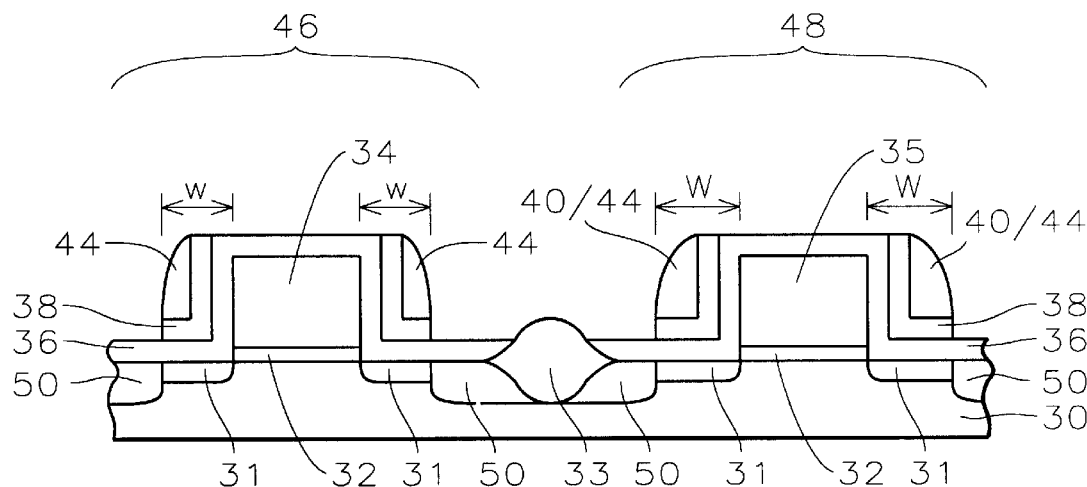

Referring now to FIG. 8, separate ion implantations (not shown) are performed on transistor 46 and transistor 48 to create the source/drain (S/D) contacts 50. As shown, the spacer width determines the length of the LDD region 31, thereby facilitating adjustment to the drain current characteristics of a MOS device.

Figure 9:
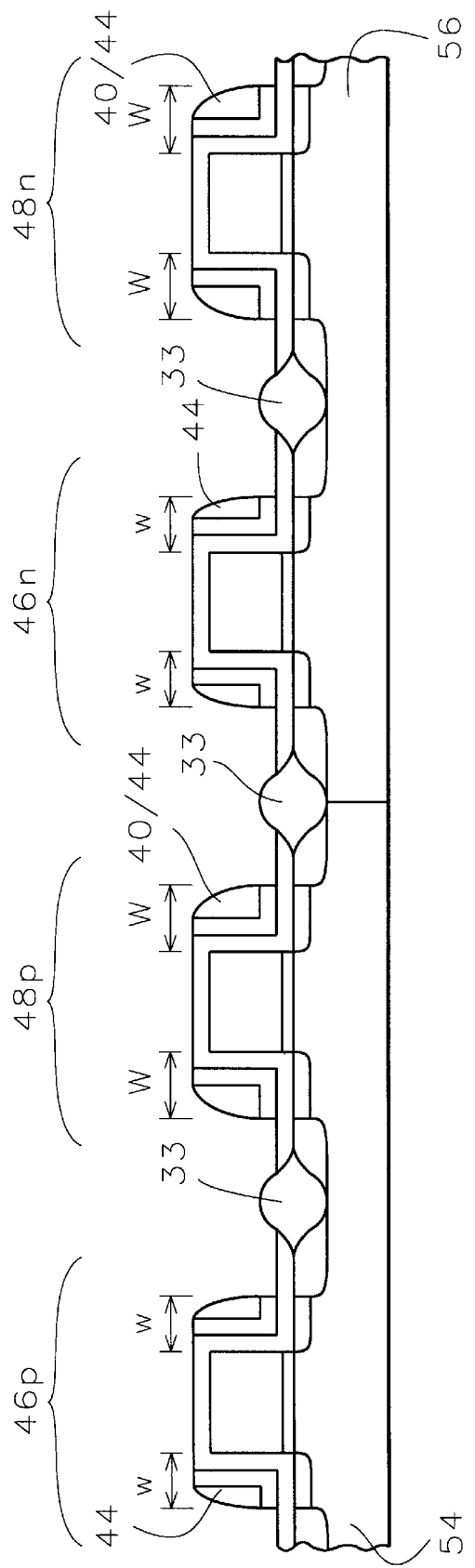

Unlike previous methods, the width of the spacers can be different for transistors of the same type (PMOS, for example). This is illustrated in FIG. 9, for example. It will be understood by those skilled in the art that typically when building PMOS and NMOS transistors (CMOS) one type of transistor is built on the substrate, while the other is built on an n or p type well. In FIG. 9, PMOS transistors 46p and 48p are built over an n-well or n-substrate 54, while NMOS transistors 46n and 48n are built over a p-substrate or p-well 56. PMOS and NMOS transistors 46p and 46n, respectively, are built with narrow spacers 44 while PMOS and NMOS transistors 48p and 48n, respectively, are built with wide spacers 40/44.

The invention demonstrates a procedure for adjusting spacer widths where only one additional masking step, one additional deposition (etch stop layer), and one additional etch steps are required. The process is self-aligning and allows for precise control of individual sidewall widths. The spacer width is controlled by the total thickness of the etch stop and spacer oxide layers, and the difference in width (W minus w) is controlled by the thickness of the first spacer oxide layer. The transistors fabricated with different spacer widths using the present invention may be NMOS, PMOS or CMOS (a combination of NMOS and PMOS). By etching away the insulating liner layer, the resulting device is compatible with the self-aligned silicide (salicide) process for metalization.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a semiconductor substrate;

providing a first and second gate structure on said semiconductor substrate;

implanting ions into said substrate not covered by said first and second gate structures to form source/drain extensions;

forming an insulating layer overlying said first and second gate structures and said substrate not covered by said first and second gate structures;

depositing an etch stop layer overlying said insulating layer;

depositing a first oxide layer overlying said etch stop layer;

patterning and etching away said first oxide layer overlying said first gate structure;

depositing a second oxide layer overlying said first oxide layer and overlying said etch stop layer where said first oxide layer has been etched away over said first gate structure;

anisotropically etching a portion of said first oxide layer and said second oxide layer to said etch stop layer thereby forming spacers along the sidewalls of said first and second device structures wherein said spacers on sidewalls of said second device structure have a width greater than the width of said spacers on sidewalls of said first device structure; and etching away said etch stop layer not covered by said spacers to said insulating layer thereby completing fabrication of said integrated circuit device.

2. The method according to claim 1 wherein said first and second device structures are MOSFET gates comprising a gate electrode layer overlying a gate oxide layer.

3. The method according to claim 1 wherein said insulating layer is composed of silicon dioxide deposited or grown by thermal oxidation, low-pressure chemical vapor deposition (LPCVD), or pressure-enhanced chemical vapor deposition (PECVD) to a thickness of between about 50 to 200 Angstroms.

4. The method according to claim 1 wherein said etch stop layer is silicon nitride or silicon oxynitride deposited by LPCVD or PECVD to a thickness of between about 100 to 300 Angstroms.

5. The method according to claim 1 wherein said first oxide layer and said second oxide layer are composed of silicon dioxide.

6. The method according to claim 1 wherein said first oxide layer is deposited by LPCVD or PECVD to a thickness of between about 100 to 400 Angstroms.

7. The method according to claim 1 wherein said second oxide layer is deposited by LPCVD or PECVD to a thickness of between about 300 to 800 Angstroms.

8. The method according to claim 1 wherein said etching of said first oxide layer and said second oxide layer to said etch stop layer is performed by dry etching using one of a group containing $C_4F_8/Ar$, $C_2F_6/Ar$, or $C_5F_8/Ar$ with etch selectivity greater than 10:1 between said first and second oxide layers and said etch stop layer.

9. The method according to claim 1 wherein said etching away of said etch stop layer is performed using a plasma etch process with a chemistry of $SF_4/HBr$ or $CF_4/HBr$.

10. A method of fabricating an integrated circuit device comprising:

providing a semiconductor substrate;

providing a first and second gate structure on said semiconductor substrate;

implanting ions into said substrate not covered by said first and second gate structures to form source/drain extensions;

forming an insulating layer overlying said first and second gate structures and said substrate not covered by said first and second gate structures;

depositing an etch stop layer overlying said insulating layer;

depositing a first oxide layer overlying said etch stop layer;

patterning and etching away said first oxide layer overlying said first gate structure;

depositing a second oxide layer overlying said first oxide layer and overlying said etch stop layer where said first gate oxide layer has been etched away over said first gate structure;

anisotropically etching a portion of said first oxide layer and said second oxide layer to said etch stop layer thereby forming spacers along the sidewalls of said first and second gate structures wherein said spacers on sidewalls of said second gate structure have a width greater than the width of said spacers on sidewalls of said first gate structure;

etching away said etch stop layer not covered by said spacers to said insulating layer; and implanting the substrate in areas not protected by said first and second structures and said spacers to form source and drain regions thereby completing fabrication of said integrated circuit device.

11. The method according to claim 10 wherein said source/drain extensions have a depth of between 800 to 1500 Angstroms.

12. The method according to claim 10 wherein said etching layer is composed of silicon dioxide deposited or grown by thermal oxidation, low-pressure chemical vapor deposition (LPCVD), or pressure-enhanced chemical vapor deposition (PECVD) to a thickness of between about 50 to 200 Angstroms.

13. The method according to claim 10 wherein said etch stop layer is silicon nitride, or silicon oxynitride deposited by LPCVD or PECVD to a thickness of between about 100 to 300 Angstroms.

14. The method according to claim 10 wherein said oxide layer and said second oxide layer are composed of silicon dioxide.

15. The method according to claim 10 wherein said first oxide layer is deposited by LPCVD or PECVD to a thickness of between about 100 to 400 Angstroms.

16. The method according to claim 10 wherein said second oxide layer is deposited by LPCVD or PECVD to a thickness of between about 300 to 800 Angstroms.

17. The method according to claim 10 wherein said etching of said first oxide layer and said second oxide layer to said etch stop layer is performed by dry etching using one of a group containing $C_4F_8/Ar$, $C_2F_6/Ar$, or $C_5F_8/Ar$ with etch selectivity greater than 10:1 between said first and second oxide layers and said etch stop layer.

18. The method according to claim 10 wherein said etching away of said etch stop layer is performed using a plasma etch process with a chemistry of $SF_4/HBr$ or $CF_4/HBr$.

19. A method of fabricating PMOS and NMOS integrated circuit devices comprising:

providing a semiconductor substrate which may contain n or p doped wells;

providing a PMOS and NMOS gate structure on said semiconductor substrate;

implanting ions into said substrate not covered by said PMOS and NMOS gate structures to form source/drain extensions;

forming an insulating layer overlying said PMOS and NMOS gate structures and said substrate not covered by said PMOS and NMOS gate structures;

depositing an etch stop layer overlying said insulating layer;

depositing a first oxide layer overlying said etch stop layer;

patterning and etching away said first oxide layer overlying said PMOS gate structure;

depositing a second oxide layer overlying said first oxide layer and overlying said etch stop layer where said first oxide layer has been etched away over said PMOS gate structure;

anisotropically etching a portion of said first oxide layer and said second oxide layer to said etch stop layer thereby forming spacers along the sidewalls of said PMOS and NMOS gate structures wherein said spacers on sidewalls of said NMOS gate structure have a width greater than the width of said spacers on sidewalls of said PMOS gate structure;

etching away said etch stop layer not covered by said spacers to said insulating layer; and implanting the substrate in areas not protected by said first and second structures and said spacers to form source and drain regions thereby completing fabrication of said PMOS and NMOS integrated circuit devices.

20. The method according to claim 19 wherein said source/drain extensions have a depth of between 800 to 1500 Angstroms.

21. The method according to claim 19 wherein said insulating layer is composed of silicon dioxide deposited or grown by thermal oxidation, low-pressure chemical vapor deposition (LPCVD), or pressure-enhanced chemical vapor deposition (PECVD) to a thickness of between about 50 to 200 Angstroms.

22. The method according to claim 19 wherein said etch stop layer is silicon nitride, or silicon oxynitride deposited by LPCVD or PECVD to a thickness of between about 100 to 300 Angstroms.

23. The method according to claim 19 wherein said first oxide layer and said second oxide layer are composed of silicon dioxide.

24. The method according to claim 19 wherein said first oxide layer is deposited by LPCVD or PECVD to a thickness of between about 100 to 400 Angstroms.

25. The method according to claim 19 wherein said second oxide layer is deposited by LPCVD or PECVD to a thickness of between about 300 to 800 Angstroms.

26. The method according to claim 19 wherein said etching of said first oxide layer and said second oxide layer to said etch stop layer is performed by dry etching using one of a group containing $C_4F_8$/Ar, $C_2F_6$/Ar, or $C_5F_8$/Ar with etch selectivity greater than 10:1 between said first and second oxide layers and said etch stop layer.

27. The method according to claim 19 wherein said etching away of said etch stop layer is performed using a plasma etch process with a chemistry of $SF_4$/HBr or $CF_4$/HBr.

* * * * *